United States Patent
Shigihara

(10) Patent No.: US 7,724,794 B2
(45) Date of Patent: May 25, 2010

(54) SEMICONDUCTOR LASER DEVICE

(75) Inventor: Kimio Shigihara, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 49 days.

(21) Appl. No.: 12/191,344

(22) Filed: Aug. 14, 2008

(65) Prior Publication Data

US 2008/0304529 A1    Dec. 11, 2008

Related U.S. Application Data

(62) Division of application No. 11/740,320, filed on Apr. 26, 2007, now Pat. No. 7,428,256.

(30) Foreign Application Priority Data

Dec. 28, 2006    (JP)    ............................. 2006-355623

(51) Int. Cl.
*H01S 5/00*    (2006.01)
(52) U.S. Cl. .................. 372/43.01; 372/45.01; 372/64
(58) Field of Classification Search .............. 372/43.01, 372/45.01
See application file for complete search history.

(56) References Cited

U.S. PATENT DOCUMENTS

2005/0169334 A1*    8/2005    Sato ............................ 372/45

FOREIGN PATENT DOCUMENTS

JP    2003-347679    12/2003

OTHER PUBLICATIONS

Knigge, A. et al.; "100 W outpower from passively cooled laser bar with 30% filling factor", *Conference Digest of 2004 IEEE 19th Intl. Semiconductor Laser Conference*, Kunibiki Messe, Matsue-shi, Simane Pref., Japan, ThAI, pp. 35-36, (Sep. 2004).

* cited by examiner

*Primary Examiner*—Dung T Nguyen
(74) *Attorney, Agent, or Firm*—Leydig, Voit & Mayer, Ltd.

(57) ABSTRACT

A semiconductor laser device includes an active layer, a pair of guiding layers sandwiching the active layer, and a pair of cladding layers sandwiching the active layer and the pair of guiding layers. The pair of guiding layers are InGaAsP lattice-matched to GaAs. The pair of cladding layers are AlGaAs. The Al composition ratios of the pair of AlGaAs cladding layers are 0.4 or less. The Al composition ratios are set such that the refractive indices of the pair of AlGaAs cladding layers do not exceed those of the pair of InGaAsP guiding layers.

4 Claims, 10 Drawing Sheets

△—△  $a_1$ : $Al_xGa_{1-x}As(x=0.25)$ cladding layer
◇—◇  $b_1$ : $Al_xGa_{1-x}As(x=0.35)$ cladding layer
○—○  $c_1$ : $Al_xGa_{1-x}As(x=0.40)$ cladding layer
■—■  $d_1$ : $Al_xGa_{1-x}As(x=0.45)$ cladding layer
●—●  $e_1$ : $In_{0.49}Ga_{0.51}P$ cladding layer ☐—☐  $a_2$ : $Al_xGa_{1-x}As(x=0.15)$ cladding layer
△—△  $b_2$ : $Al_xGa_{1-x}As(x=0.25)$ cladding layer
◇—◇  $c_2$ : $Al_xGa_{1-x}As(x=0.35)$ cladding layer
○—○  $d_2$ : $Al_xGa_{1-x}As(x=0.40)$ cladding layer
■—■  $e_2$ : $Al_xGa_{1-x}As(x=0.45)$ cladding layer
●—●  $f_2$ : $In_{0.49}Ga_{0.51}P$ cladding layer ☐—☐  $a_3$ : $Al_xGa_{1-x}As(x=0.15)$ cladding layer
△—△  $b_3$ : $Al_xGa_{1-x}As(x=0.25)$ cladding layer
◇—◇  $c_3$ : $Al_xGa_{1-x}As(x=0.35)$ cladding layer
○—○  $d_3$ : $Al_xGa_{1-x}As(x=0.40)$ cladding layer
■—■  $e_3$ : $Al_xGa_{1-x}As(x=0.45)$ cladding layer
●—●  $f_3$ : $In_{0.49}Ga_{0.51}P$ cladding layer □—□ $a_5$ : InGaAsP cladding layer (s=s'=0.1,t=t'=0.56)
△—△ $b_5$ : InGaAsP cladding layer (s=s'=0.2,t=t'=0.61)
◇—◇ $c_5$ : InGaAsP cladding layer (s=s'=0.3,t=t'=0.66)
●—● $d_5$ : $Al_{0.15}Ga_{0.35}In_{0.50}P$ cladding layer

SEMICONDUCTOR LASER DEVICE

BACKGROUND OF THE INVENTION

1. Field of the Invention

The present invention relates to semiconductor laser devices, and more particularly to semiconductor laser devices used as pumping light sources, including solid lasers such as Nd- or Yb-doped YAG lasers, Yb-doped fiber lasers, and Er-doped fiber amplifiers.

2. Background Art

Semiconductor laser devices have been widely used as light sources for optical communications. For example, a conventional 940 nm semiconductor laser device has a structure made up of: an n-type GaAs substrate; an n-electrode disposed on one principal surface of the n-type GaAs substrate; and an n-type $Al_{0.7}Ga_{0.3}As$ cladding layer, an $Al_{0.35}Ga_{0.65}As$ guiding layer, a GaAsP barrier layer, an InGaAs active layer, another GaAsP barrier layer, another $Al_{0.35}Ga_{0.65}As$ guiding layer, a p-type $Al_{0.7}Ga_{0.3}As$ cladding layer, a p-type GaAs contact layer, and a p-electrode, sequentially disposed on the other principal surface of the n-type GaAs substrate. (See, e.g., A. Knigge et al., "100 W output power from passively cooled laser bar with 30% filling factor," Conference Digest of 2004 IEEE 19$^{th}$ International Semiconductor Laser Conference, Kunibiki Messe, Matsueshi, Simane Pref., Japan, ThA1, pp. 35-36, September 2004.)

However, this semiconductor laser device has reliability problems, since it includes Al (aluminum) near the active layer.

Further, in recent years there has been an increasing need for semiconductor lasers having a high electrical-to-optical power conversion efficiency, in order to reduce power consumption. However, we are already approaching the point where the slope efficiency of a semiconductor laser device can no longer be improved by increasing the internal quantum efficiency or reducing losses. Therefore, some other method must be found to further enhance the electrical-to-optical power conversion efficiency.

SUMMARY OF THE INVENTION

The present invention has been devised in view of the above problems. It is, therefore, an object of the present invention to provide a high reliability semiconductor laser device having reduced power consumption.

According to the first aspect of the present invention, a semiconductor laser device includes an active layer, a pair of guiding layers sandwiching the active layer, and a pair of cladding layers sandwiching the active layer and the pair of guiding layers. The pair of guiding layers are formed of InGaAsP lattice-matched to GaAs. The pair of cladding layers are formed of AlGaAs. The Al composition ratios of the pair of AlGaAs cladding layers are 0.4 or less. And the Al composition ratios are set such that the refractive indices of the pair of AlGaAs cladding layers do not exceed those of the pair of InGaAsP guiding layers.

According to the second aspect of the present invention, a semiconductor laser device includes an active layer, a pair of guiding layers sandwiching said active layer, and a pair of cladding layers sandwiching said active layer and said pair of guiding layers. The pair of guiding layers are formed of InGaAsP lattice-matched to GaAs. The pair of cladding layers are formed of InGaAsP. The As composition of each InGaAsP cladding layer does not exceed that of the closer one of said pair of InGaAsP guiding layers.

Other and further objects, features and advantages of the invention will appear more fully from the following description.

DETAILED DESCRIPTION OF THE PREFERRED EMBODIMENTS

First Embodiment

Figure 1:
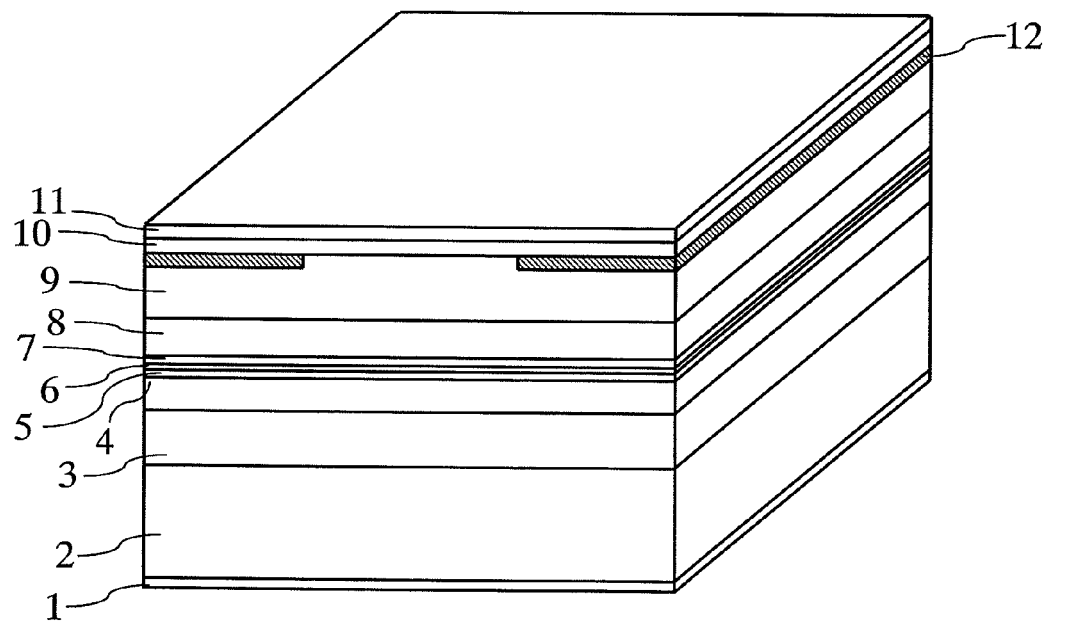
FIG. 1 is a perspective view of a semiconductor laser device according to a first embodiment of the present invention.
Figure 1:
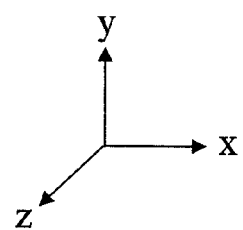

FIG. 1 is a perspective view of a semiconductor laser device according to a first embodiment of the present invention. In FIG. 1, reference numeral 1 denotes an n-electrode; 2, an n-type GaAs substrate; 3, an n-type $Al_xGa_{1-x}As$ cladding layer (where $x \leq 0.40$); 4, an n-side $In_{1-z}Ga_zAs_yP_{1-y}$ guiding layer (where $0.6 \leq y \leq 0.8$); 5, an n-side $GaAs_{0.88}P_{0.12}$ enhancement layer; 6, an $In_{0.07}Ga_{0.93}As$ active layer; 7, a p-side $GaAs_{0.88}P_{0.12}$ enhancement layer; 8, a p-side $In_{1-z}Ga_zAs_yP_{1-y}$ guiding layer (where $0.6 \leq y \leq 0.8$); 9, a p-type $Al_xGa_{1-x}As$ cladding layer (where $x \leq 0.40$); 10, a p-type GaAs contact layer; 11, a p-electrode; and 12, proton injection regions.

In order to achieve an oscillation wavelength close to 940 nm, the InGaAs active layer 6 preferably, but not necessarily, has an In composition ratio of approximately 0.07 and a thickness of 12 nm.

The n-side $In_{1-z}Ga_zAs_yP_{1-y}$ guiding layer 4 and the p-side $In_{1-z}Ga_zAs_yP_{1-y}$ guiding layer 8, which are undoped layers, preferably have a thickness of 100 nm or more to confine an increased amount of light therein. This decreases light absorption and thereby reduces losses, resulting in increased efficiency of the semiconductor laser device. Since the carrier diffusion length is approximately 2 μm to 3 μm, the maximum allowable thickness of the guiding layers is thought to be approximately 1 μm to 1.5 μm (approximately one half of the carrier diffusion length).

It was reported that the As composition ratio (y) and the Ga composition ratio (z) of an $In_{1-z}Ga_zAs_yP_{1-y}$ layer lattice-matched to GaAs have the following relationship: $z=(0.2155+0.1896*y)/(0.4176-0.0125*y)$. (See N. Shin-ichi et al., "Fabrication methods for InGaAsP/GaAs visible laser structure with AlGaAs burying layers grown by liquid-phase epitaxy," J. Appl. Phys., Feb. 1, 1986, vol. 59, No. 3, p. 761-768.) Therefore, the As composition ratios and Ga composition ratios of the n-side $In_{1-z}Ga_zAs_yP_{1-y}$ guiding layer 4 and the p-side $In_{1-z}Ga_zAs_yP_{1-y}$ guiding layer 8 are assumed to also have the above relationship.

When a voltage is applied between the n-electrode 1 and the p-electrode 11 of the semiconductor laser device, electrons are injected from the side of the n-type $Al_xGa_{1-x}As$ cladding layer 3 to the active layer 6. At the same time, holes are injected from the side of the p-type $Al_xGa_{1-x}As$ cladding layer 9 to the active layer 6. These electrons and holes combine within the active layer 6 to emit a laser beam. It should be noted that the proton injection regions 12 are formed to have an increased resistance and hence the current flows away from these regions. As a result, the current flows predominantly through regions other than the proton injection regions 12.

Figure 2:
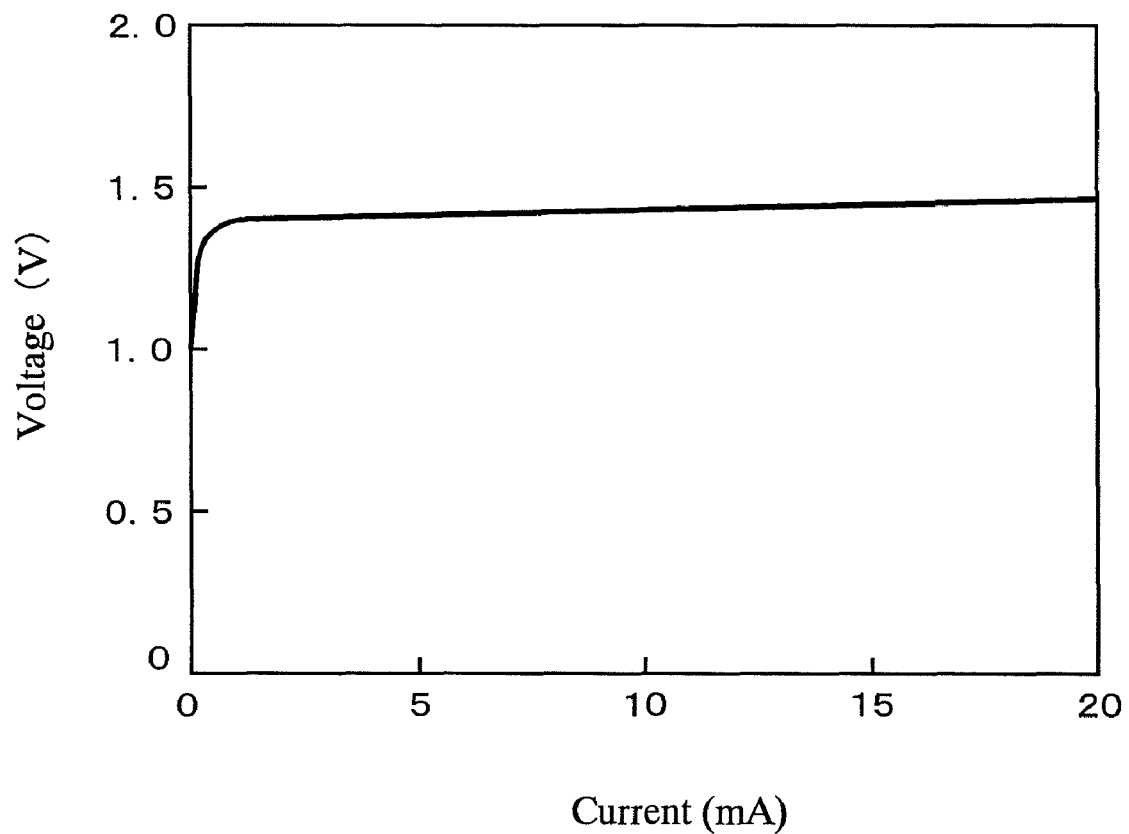
FIG. 2 shows simulation results of the current vs. voltage characteristic of the semiconductor laser device shown in FIG. 1.

FIG. 2 shows simulation results of the current vs. voltage characteristic of the semiconductor laser device shown in FIG. 1. It should be noted that the n-type $Al_xGa_{1-x}As$ cladding layer 3 and the p-type $Al_xGa_{1-x}As$ cladding layer 9 were assumed to have an Al composition ratio (x) of 0.25. Further, the n-side $In_{1-z}Ga_zAs_yP_{1-y}$ guiding layer 4 and the p-side $In_{1-z}Ga_zAs_yP_{1-y}$ guiding layer 8 were assumed to have an As composition ratio (y) of 0.60, a Ga composition ratio (z) of 0.80, and a thickness of 600 nm. Further, the resonator length and the stripe width were assumed to be 1,200 μm and 1 μm, respectively. It should be noted, however, that the present invention is not limited to this example.

FIG. 2 indicates that when the injection current was 20 mA, the operating voltage was 1.426 V.

Figure 3:
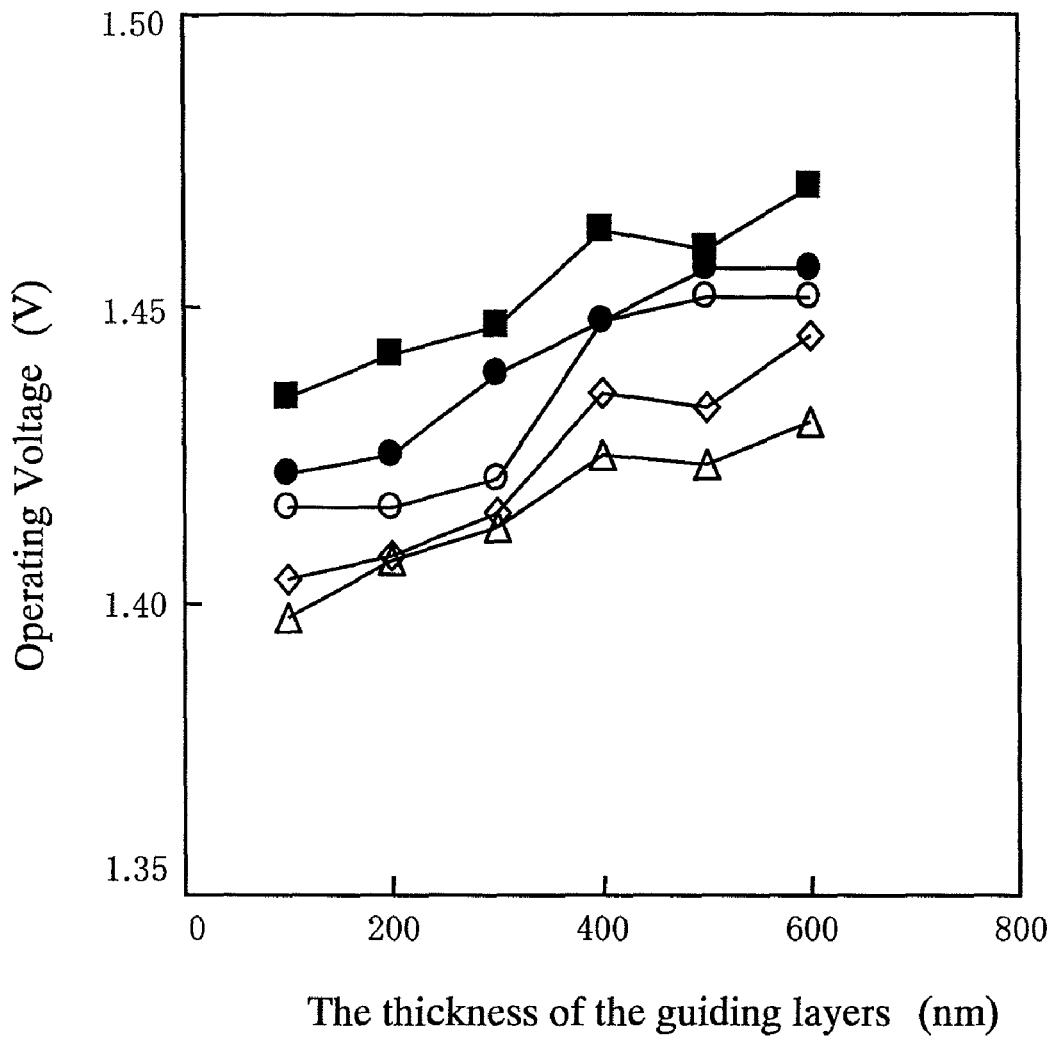
FIG. 3 shows the relationship between the thickness of the guiding layers and the device operating voltage for various cladding layers.

FIG. 3 shows the relationship between the thickness of the guiding layers and the device operating voltage for various cladding layers. It should be noted that the n-side $In_{1-z}Ga_zAs_yP_{1-y}$ guiding layer 4 and the p-side $In_{1-z}Ga_zAs_yP_{1-y}$ guiding layer 8 have an As composition ratio (y) of 0.60 and a Ga composition ratio (z) of 0.80. Further, the injection current is 20 mA.

In FIG. 3, reference numerals $a_1$, $b_1$, and $c_1$ indicate semiconductor laser devices that employ different $Al_xGa_{1-x}As$ cladding layers of the present invention. Specifically, reference numeral $a_1$ indicates $Al_{0.25}Ga_{0.75}As$ (i.e., x=0.25); $b_1$ indicates $Al_{0.35}Ga_{0.65}As$ (i.e., x=0.35); and $c_1$ indicates $Al_{0.40}Ga_{0.60}As$ (i.e. x=0.40). Further, reference numeral $d_1$ indicates a semiconductor laser device (comparative sample 1) that employs $Al_{0.45}Ga_{0.55}As$ cladding layers (i.e., x=0.45). Further, reference numeral $e_1$ indicates a semiconductor laser device (comparative sample 2) that includes $In_{0.49}Ga_{0.51}P$ cladding layers as its n-side and p-side cladding layers. Also in this semiconductor laser device, the n-side $In_{1-z}Ga_zAs_yP_{1-y}$ guiding layer 4 and the p-side $In_{1-z}Ga_zAs_yP_{1-y}$ guiding layer 8 (shown in FIG. 1) have an As composition ratio (y) of 0.60 and a Ga composition ratio (z) of 0.80.

The semiconductor laser devices of the present embodiment shown in FIG. 3 (employing AlGaAs cladding layers having an Al composition ratio of 0.25 to 0.4) have a lower operating voltage than comparative samples 1 and 2 regardless of the thickness of the guiding layers. That is, the use of $Al_xGa_{1-x}As$ cladding layers having an Al composition ratio (x) of 0.40 or less allows a semiconductor laser device to have a reduced operating voltage, as compared to the use of InGaP cladding layers.

Figure 4:
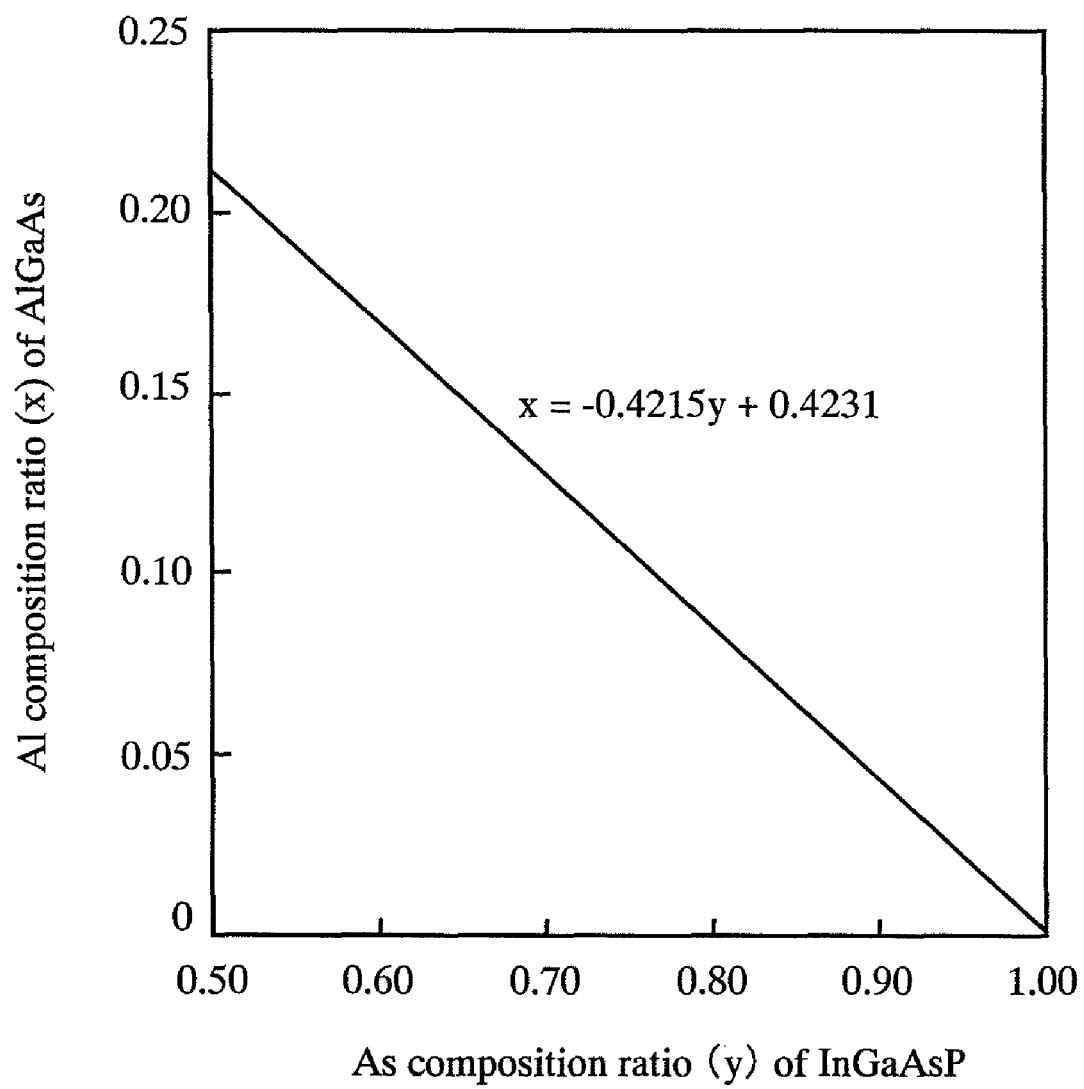
FIG. 4 shows the relationship between the As composition ratio of the InGaAsP guiding layers and the Al composition ratio of the AlGaAs cladding layers.

FIG. 4 shows the relationship between the As composition ratio (y) of the InGaAsP guiding layers (4, 8) and the Al composition ratio (x) of the AlGaAs cladding layers (3, 9) when their refractive indices are equal to each other at a wavelength of 940 nm. This relationship is expressed by the equation: $x=-0.4215*y+0.4231$. For a method for establishing such a relational equation, see Ken-ichi Iga, "Applied Physics Series: Semiconductor Laser," first edition, Ohmsha Ltd., Oct. 25, 1994, p. 34-39 (nonpatent document).

For example, for an AlGaAs cladding layer to have a refractive index equal to that of an InGaAsP guiding layer having an As composition ratio (y) of 0.60, it must have an Al composition ratio (x) of 0.170, as can be seen from FIG. 4. If the Al composition ratio (x) of the AlGaAs cladding layer is lower than 0.170, the refractive index of the AlGaAs cladding layer exceeds that of the InGaAsP guiding layer, which prevents the InGaAsP guiding layer from efficiently confining light therein. Therefore, in this example, the AlGaAs cladding layer must have an Al composition ratio (x) of at least 0.170.

Figure 5:
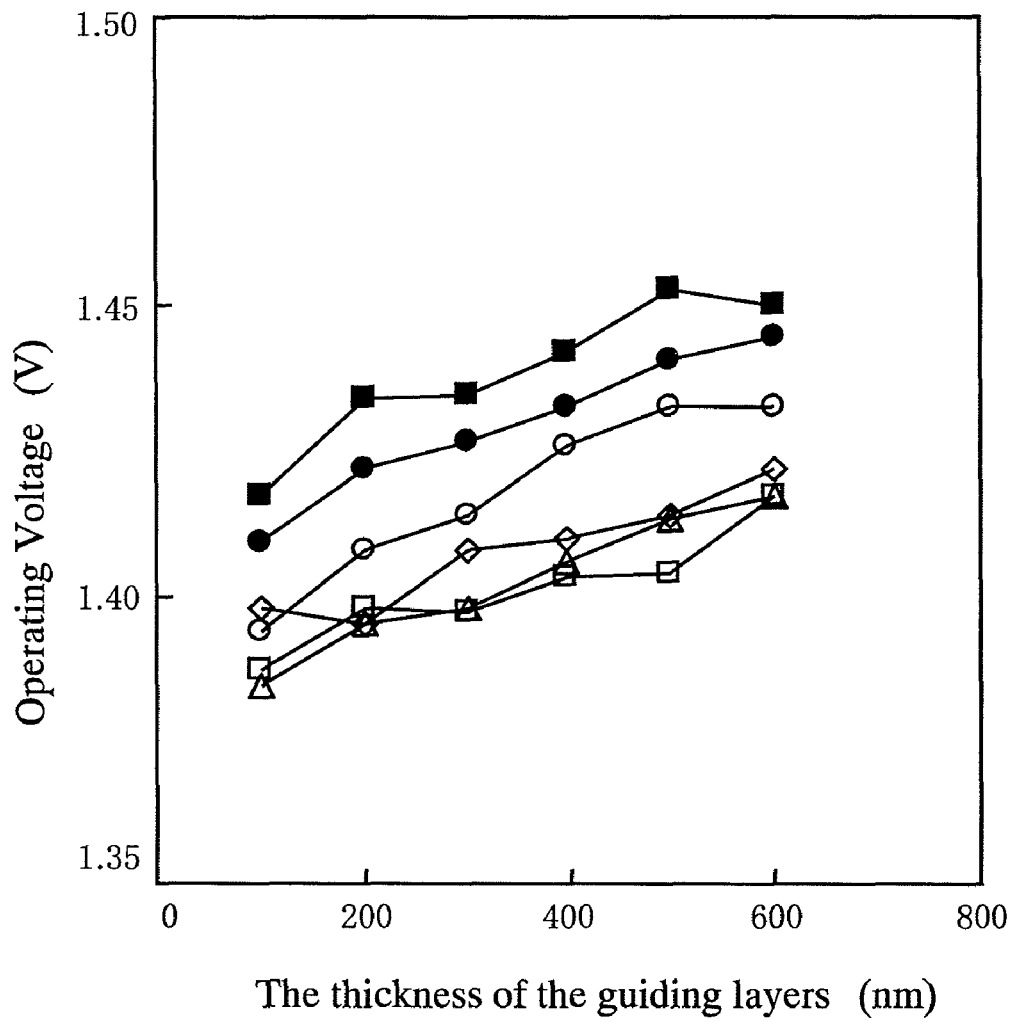
FIG. 5 is another diagram showing the relationship between the thickness of the guiding layers and the device operating voltage for various cladding layers.

FIG. 5 is another diagram showing the relationship between the thickness of the guiding layers and the device operating voltage for various cladding layers. It should be noted that in this case, the n-side $In_{1-z}Ga_zAs_yP_{1-y}$ guiding layer 4 and the p-side $In_{1-z}Ga_zAs_yP_{1-y}$ guiding layer 8 have an As composition ratio (y) of 0.70 and a Ga composition ratio (z) of 0.85. Further, the injection current is 20 mA, as in the above example.

In FIG. 5, reference numerals $a_2$, $b_2$, $c_2$, and $d_2$ indicate semiconductor laser devices that employ different $Al_xGa_{1-x}As$ cladding layers of the present invention. Specifically, reference numeral $a_2$ indicates $Al_{0.15}Ga_{0.85}As$ (i.e., x=0.15); $b_2$ indicates $Al_{0.25}Ga_{0.75}As$ (i.e., x=0.25); $c_2$ indicates $Al_{0.35}Ga_{0.65}As$ (i.e., x=0.35); and $d_2$ indicates $Al_{0.4}Ga_{0.6}As$ (i.e., x=0.40). Further, reference numeral $e_2$ indicates a semiconductor laser device (comparative sample 1) that employs $Al_{0.45}Ga_{0.55}As$ cladding layers (i.e., x=0.45). Further, reference numeral $f_2$ indicates a semiconductor laser device (comparative sample 2) that includes $In_{0.49}Ga_{0.51}P$ cladding layers as its n-side and p-side cladding layers. Also in this semiconductor laser device, the n-side $In_{1-z}Ga_zAs_yP_{1-y}$ guiding layer 4 and the p-side $In_{1-z}Ga_zAs_yP_{1-y}$ guiding layer 8 (shown in FIG. 1) have an As composition ratio (y) of 0.70 and a Ga composition ratio (z) of 0.85.

The semiconductor laser devices of the present embodiment shown in FIG. 5 (employing AlGaAs cladding layers having an Al composition ratio of 0.15 to 0.4) have a lower operating voltage than comparative samples 1 and 2 regardless of the thickness of the guiding layers. That is, the use of $Al_xGa_{1-x}As$ cladding layers having an Al composition ratio (x) of 0.40 or less allows a semiconductor laser device to have a reduced operating voltage, as compared to the use of InGaP cladding layers.

The relation equation $x=-0.4215*y+0.4231$ shown in FIG. 4 can also be used to determine the As composition ratio (y) of the InGaAsP guiding layers (4, 8) and the Al composition ratio (x) of the AlGaAs cladding layers (3, 9) when their refractive indices are equal to each other at a wavelength of 940 nm. For example, for an AlGaAs cladding layer to have a refractive index equal to that of an InGaAsP guiding layer having an As composition ratio (y) of 0.70, it must have an Al composition ratio (x) of 0.128. If the Al composition ratio (x) of the AlGaAs cladding layer is lower than 0.128, the refractive index of the AlGaAs cladding layer exceeds that of the InGaAsP guiding layer, which prevents the InGaAsP guiding layer from efficiently confining light therein. Therefore, in this example, the AlGaAs cladding layer must have an Al composition ratio (x) of at least 0.128.

Figure 6:
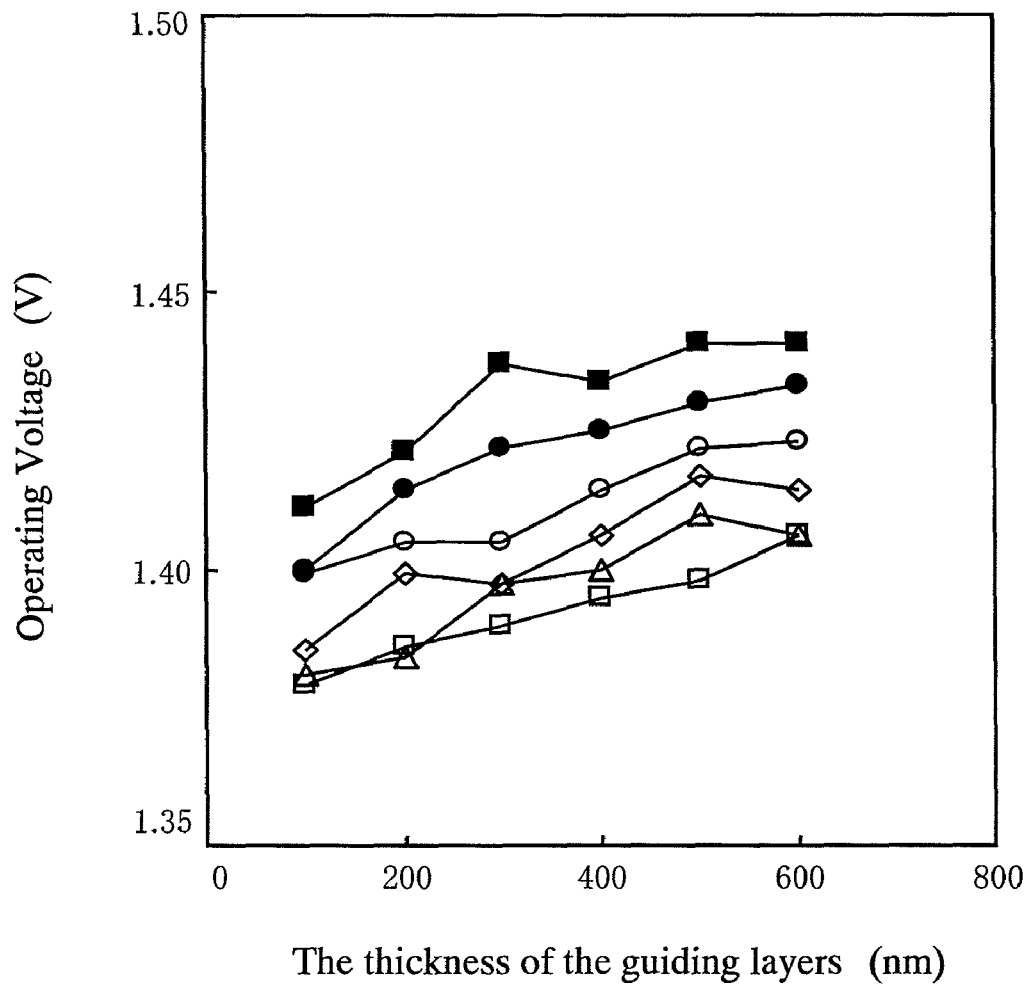
FIG. 6 is still another diagram showing the relationship between the thickness of the guiding layers and the device operating voltage for various cladding layers.

FIG. 6 is still another diagram showing the relationship between the thickness of the guiding layers and the device operating voltage for various cladding layers. It should be noted that in this case, the n-side $In_{1-z}Ga_zAs_yP_{1-y}$ guiding layer 4 and the p-side $In_{1-z}Ga_zAs_yP_{1-y}$ guiding layer 8 have an As composition ratio (y) of 0.80 and a Ga composition ratio (z) of 0.90. Further, the injection current is 20 mA, as in the above example.

In FIG. 6, reference numerals $a_3$, $b_3$, $c_3$, and $d_3$ indicate semiconductor laser devices that employ different $Al_xGa_{1-x}As$ cladding layers of the present invention. Specifically, reference numeral $a_3$ indicates $Al_{0.15}Ga_{0.85}As$ (i.e., x=0.15); $b_3$ indicates $Al_{0.25}Ga_{0.75}As$ (i.e., x=0.25); $c_3$ indicates $Al_{0.35}Ga_{0.65}As$ (i.e., x=0.35); and $d_3$ indicates $Al_{0.4}Ga_{0.6}As$ (i.e., x=0.40). Further, reference numeral $e_3$ indicates a semiconductor laser device (comparative sample 1) that employs $Al_{0.45}Ga_{0.55}As$ cladding layers (i.e., x=0.45). Further, reference numeral $f_3$ indicates a semiconductor laser device (comparative sample 2) that includes $In_{0.49}Ga_{0.51}P$ cladding layers as its n-side and p-side cladding layers. Also in this semiconductor laser device, the n-side $In_{1-z}Ga_zAs_yP_{1-y}$ guiding layer 4 and the p-side $In_{1-z}Ga_zAs_yP_{1-y}$ guiding layer 8 (shown in FIG. 1) have an As composition ratio (y) of 0.80 and a Ga composition ratio (z) of 0.90.

The semiconductor laser devices of the present embodiment shown in FIG. 6 (employing AlGaAs cladding layers having an Al composition ratio of 0.15 to 0.4) have a lower operating voltage than comparative samples 1 and 2 regardless of the thickness of the guiding layers. That is, the use of $Al_xGa_{1-x}As$ cladding layers having an Al composition ratio (x) of 0.40 or less allows a semiconductor laser device to have a reduced operating voltage, as compared to the use of InGaP cladding layers.

The relational equation x=−0.4215*y+0.4231 shown in FIG. 4 can also be used to determine the As composition ratio (y) of the InGaAsP guiding layers (4, 8) and the Al composition ratio (x) of the AlGaAs cladding layers (3, 9) when their refractive indices are equal to each other at a wavelength of 940 nm. For example, in order for an AlGaAs cladding layer to have a refractive index equal to that of an InGaAsP guiding layer having an As composition ratio (y) of 0.80, it must have an Al composition ratio (x) of 0.086. If the Al composition ratio (x) of the AlGaAs cladding layer is lower than 0.086, the refractive index of the AlGaAs cladding layer exceeds that of the InGaAsP guiding layer, which prevents the InGaAsP guiding layer from efficiently confining light therein. Therefore, in this example, the AlGaAs cladding layer must have an Al composition ratio (x) of at least 0.086.

Thus, the semiconductor laser devices of the present embodiment employ $Al_xGa_{1-x}As$ cladding layers having a low Al composition ratio (x) (namely, 0.40 or less), which allows these semiconductor laser devices to have reduced power consumption and enhanced reliability.

It should be understood that the present invention is not limited to the embodiments described above, and various alterations may be made thereto without departing from the spirit and scope of the invention.

For example, although the InGaAs active layers of the semiconductor laser devices of the present embodiment have been described as having an In composition ratio of 0.07, the present invention is not limited to such InGaAs active layers. For example, the oscillation wavelength of the semiconductor laser devices can be varied from approximately 900 to 1,100 nm by changing the In composition ratio of the active layer from approximately 0 to 0.2. However, with an active layer having an In composition ratio other than 0.07, a relational equation, such as that described above, must be newly established so as to be able to determine the As composition ratio (y) of the $In_{1-z}Ga_zAs_yP_{1-y}$ guiding layers and the Al composition ratio (x) of the $Al_xGa_{1-x}As$ cladding layers when their refractive indices are equal to each other at the oscillation wavelength.

Further, although the semiconductor laser devices of the present embodiment have been described as having a single quantum well structure (i.e., having a single active layer), the present invention is not limited to this particular quantum well structure. The present invention can be applied to semiconductor laser devices having a multiquantum well structure (i.e., having a plurality of active layers), with the same effect.

Further, although the enhancement layers of the semiconductor laser devices of the present embodiment have been described as being GaAsP layers having a P composition ratio of 0.12, the present invention is not limited to such enhancement layers. For example, since the enhancement layers of these semiconductor laser devices have a function to counterbalance the strain caused by the InGaAs active layer, the P composition ratios of these enhancement layers are preferably increased as the In composition ratio of the active layer is increased. Further, if the band structure of the active layer is varied by deliberately applying a compressive strain to it, the semiconductor laser devices may not include enhancement layers.

The semiconductor laser devices of the present embodiment employ $In_{1-z}Ga_zAs_yP_{1-y}$ guiding layers having As composition ratios of 0.6, 0.7, and 0.8, respectively, and the above description has shown that these semiconductor laser devices can be adapted to have a reduced operating voltage. It should be noted, however, that the present invention is not limited to such InGaAsP guiding layers (having an As composition ratio of 0.6 to 0.8). The present embodiment allows a semiconductor laser device to have a reduced operating voltage even if it employs InGaAsP guiding layers having an As composition ratio lower than 0.6 or higher than 0.8.

That is, the present embodiment allows a semiconductor laser device to have a reduced operating voltage even if it employs InGaAsP guiding layers having an As composition ratio close to 0 (that is, having a bandgap energy close to that of InGaP) or close to 1 (that is, having a bandgap energy close to that of GaAs). However, when the As composition ratio of the guiding layers is close to 0, the amount of reduction in operating voltage is small, since their bandgap energy is close to that of the cladding layers. When the As composition ratio of the guiding layers is close to 1, on the other hand, the difference in bandgap energy between the active layer and the guiding layers is small, which prevents the active layer from efficiently confining carriers such as electrons and holes therein. This may result in a reduced electrical-to-optical power conversion efficiency. Therefore, the guiding layers preferably have an As composition ratio of 0.6 to 0.8.

Further, the n-side and p-side guiding layers of the semiconductor laser devices of the present embodiment have been described as having the same As composition ratio, and furthermore the n-type and p-type cladding layers have been described as having the same Al composition ratio and the same As composition ratio. However, the present invention is not limited to such an arrangement. The semiconductor laser devices can be adapted to have a reduced operating voltage even if their n-side and p-side guiding layers have different As composition ratios or their n-type and p-type cladding layers have different Al composition ratios or different As composition ratios.

Second Embodiment

Figure 7:
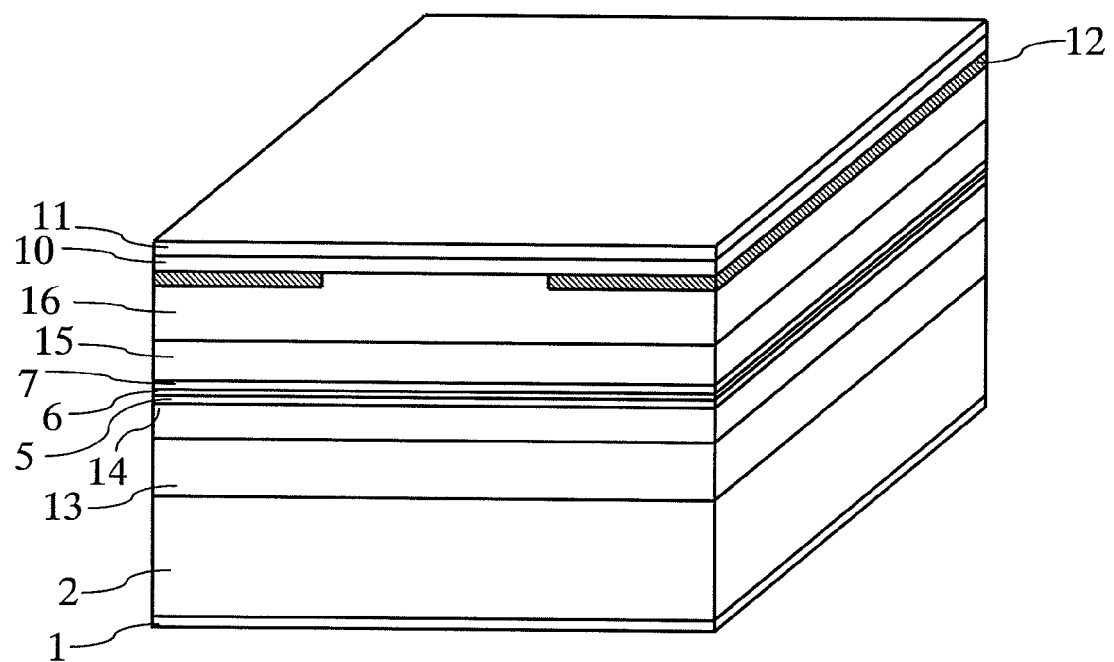
FIG. 7 is a perspective view of a semiconductor laser device according to a second embodiment of the present invention.
Figure 7:
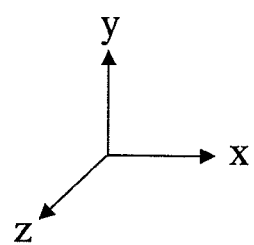

FIG. 7 is a perspective view of a semiconductor laser device according to a second embodiment of the present invention. It should be noted that components common to FIG. 1 are designated by the same reference numerals. In FIG. 7, reference numeral 1 denotes an n-electrode; 2, an n-type GaAs substrate; 5, an n-side $GaAs_{0.88}P_{0.12}$ enhancement layer; 6, an $In_{0.07}Ga_{0.93}As$ active layer; 7, a p-side $GaAs_{0.88}P_{0.12}$ enhancement layer; 10, a p-type GaAs contact layer; 11, a p-electrode; and 12, proton injection regions.

The semiconductor laser devices of the first embodiment employ $Al_xGa_{1-x}As$ cladding layers (where $x \leq 0.40$) and $In_{1-z}Ga_zAs_yP_{1-y}$ guiding layers (where $0.6 \leq y \leq 0.8$). On the other hand, semiconductor laser devices of the present embodiment employ InGaAsP cladding layers and InGaAsP guiding layers formed such that the As composition ratios of the cladding layers do not exceed those of the guiding layers. Specifically, in FIG. 7, reference numeral 13 denotes an n-type $In_{1-t}Ga_tAs_sP_{1-s}$ cladding layer (where $s \leq y$); 14, an n-side $In_{1-z}Ga_zAs_yP_{1-y}$ guiding layer; 15, a p-side $In_{1-z'}Ga_{z'}As_{y'}P_{1-y'}$ guiding layer; and 16, a p-type $In_{1-t'}Ga_{t'}As_{s'}P_{1-s'}$ cladding layer (where $s' \leq y'$).

Figure 8:
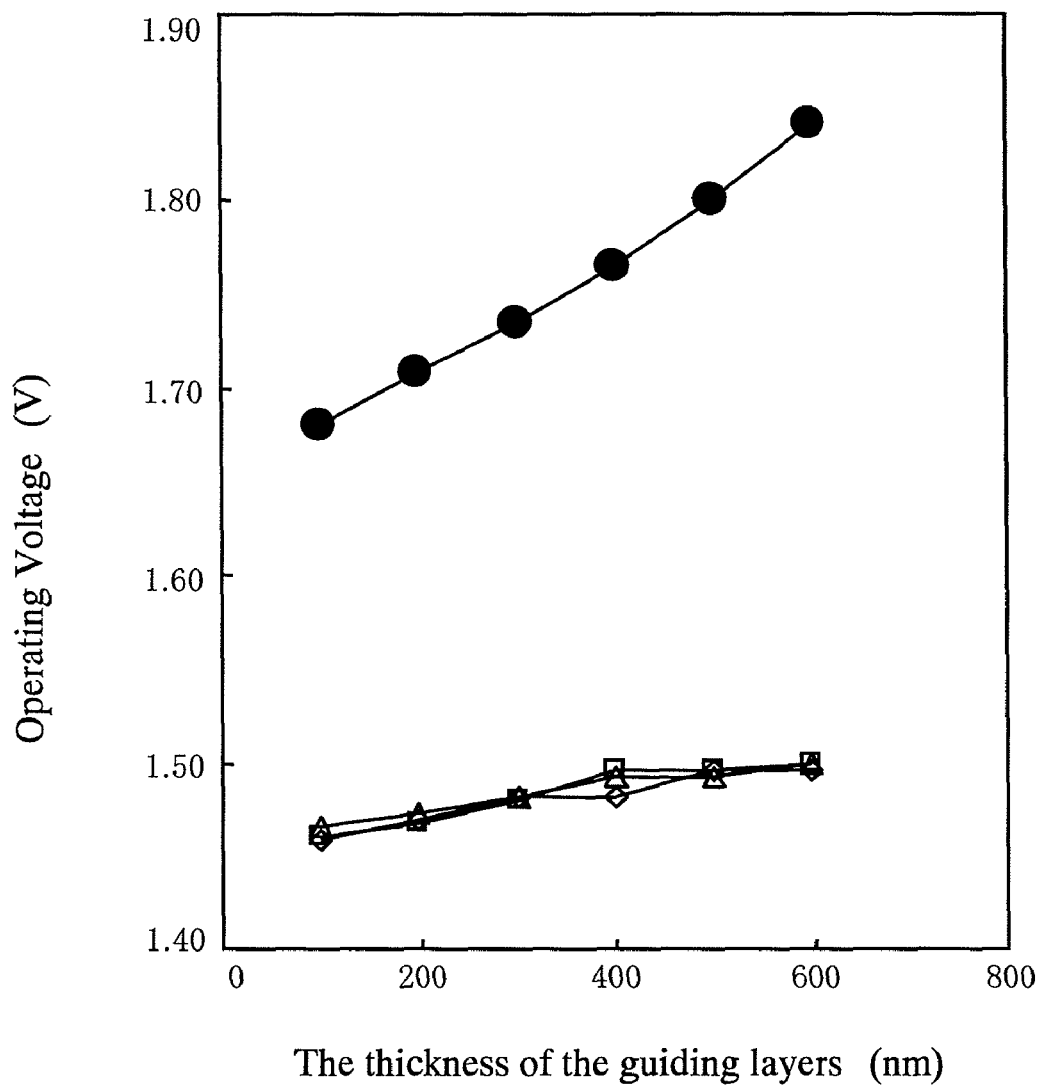
FIG. 8 shows the relationship between the thickness of the guiding layers and the device operating voltage for various cladding layers.

FIG. 8 shows the relationship between the thickness of the guiding layers and the device operating voltage for various cladding layers. It should be noted that the n-side $In_{1-z}Ga_zAs_yP_{1-y}$ guiding layer 14 and the p-side $In_{1-z'}Ga_{z'}As_{y'}P_{1-y'}$ guiding layer 15 have an As composition ratio (y, y') of 0.60 and a Ga composition ratio (z, z') of 0.80. Further, the injection current is 20 mA.

In FIG. 8, reference numerals $a_4$, $b_4$, and $c_4$ indicate semiconductor laser devices that employ different n-type $In_{1-t}Ga_tAs_sP_{1-s}$ cladding layers and different p-type $In_{1-t'}Ga_{t'}As_{s'}P_{1-s'}$ cladding layers of the present invention. Specifically, reference numeral $a_4$ indicates a semiconductor laser device that employs an n-type $In_{0.44}Ga_{0.56}As_{0.1}P_{0.9}$ cladding layer and a p-type $In_{0.44}Ga_{0.56}As_{0.1}P_{0.9}$ cladding layer (i.e., $s=s'=0.1$, and $t=t'=0.56$). Reference numeral $b_4$ indicates a semiconductor laser device that employs an n-type $In_{0.39}Ga_{0.61}As_{0.2}P_{0.8}$ cladding layer and a p-type $In_{0.39}Ga_{0.61}As_{0.2}P_{0.8}$ cladding layer (i.e., $s=s'=0.2$, and $t=t'=0.61$). Reference numeral $c_4$ indicates a semiconductor laser device that employs an n-type $In_{0.34}Ga_{0.66}As_{0.3}P_{0.7}$ cladding layer and a p-type $In_{0.34}Ga_{0.66}As_{0.3}P_{0.7}$ cladding layer (i.e., $s=s'=0.3$, and $t=t'=0.66$). Further, reference numeral $d_4$ indicates a semiconductor laser device (comparative sample) that includes $Al_{0.15}Ga_{0.35}In_{0.50}P$ cladding layers as its n-side and p-side cladding layers. Also in this semiconductor laser device, the n-side $In_{1-z}Ga_zAs_yP_{1-y}$ guiding layer 14 and the p-side $In_{1-z'}Ga_{z'}As_{y'}P_{1-y'}$ guiding layer 15 (shown in FIG. 7) have an As composition ratio (y, y') of 0.60 and a Ga composition ratio (z, z') of 0.80.

The semiconductor laser devices of the present embodiment shown in FIG. 8 (employing InGaAsP cladding layers as described above) have a lower operating voltage than the comparative sample regardless of the thickness of the guiding layers. It should be noted that although the InGaAsP cladding layers of these semiconductor devices have As composition ratios of 0.1, 0.2, and 0.3, respectively, the present invention is not limited to such cladding layers. The present embodiment allows a semiconductor laser device to oscillate with a reduced operating voltage if the As composition ratios of the cladding layers do not exceed those of the guiding layers.

As shown in FIG. 8, the guiding layers have a thickness of 100 nm or more to confine an increased amount of light therein. This decreases light absorption and thereby reduces losses, resulting in increased efficiency of the semiconductor laser device. It should be noted that since the carrier diffusion length is approximately 2 μm to 3 μm, the maximum allowable thickness of the guiding layers is thought to be approximately 1 μm to 1.5 μm (approximately one half of the carrier diffusion length). On the other hand, their minimum thickness is preferably, but not necessarily, 100 nm for the reasons described above.

Figure 9:
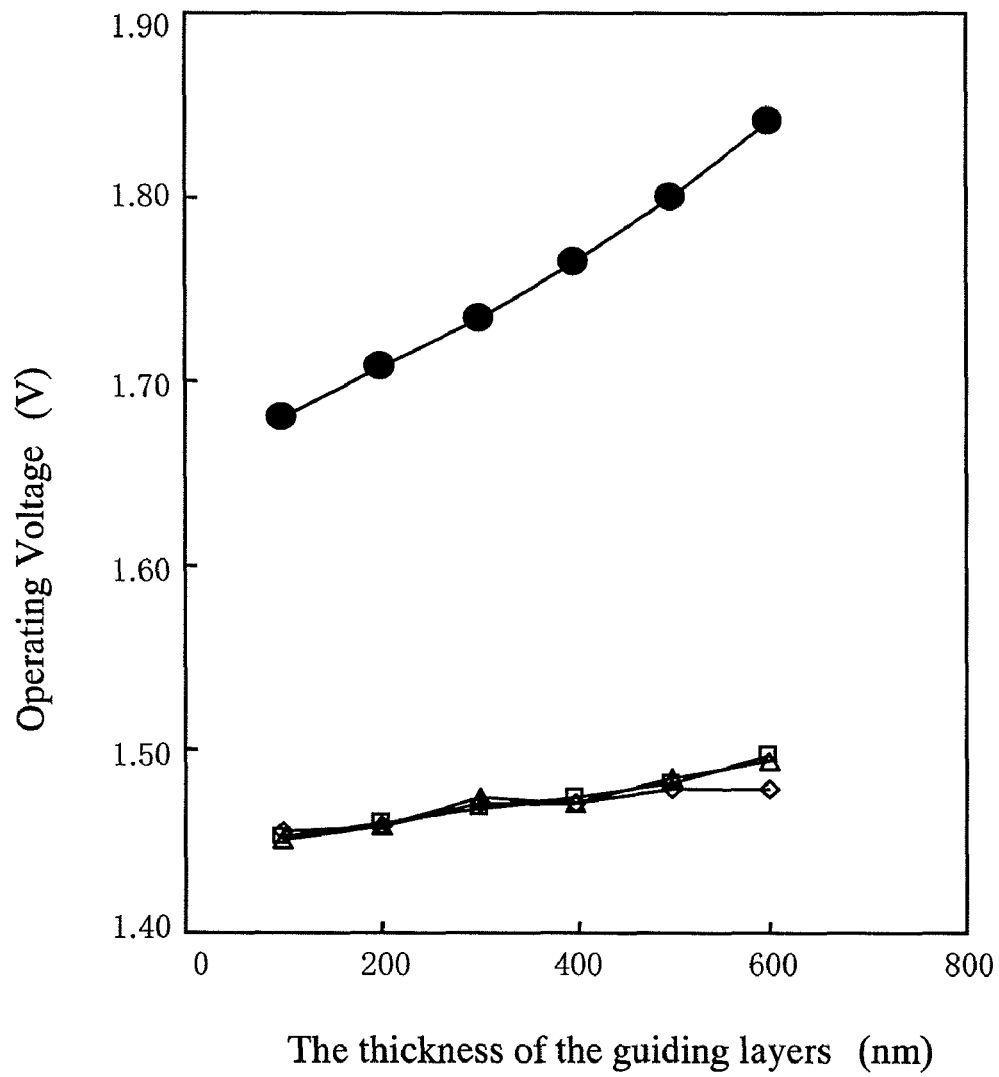
FIG. 9 shows another diagram showing the relationship between the thickness of the guiding layers and the device operating voltage for various cladding layers.

FIG. 9 shows another diagram showing the relationship between the thickness of the guiding layers and the device operating voltage for various cladding layers. It should be noted that the n-side $In_{1-z}Ga_zAs_yP_{1-y}$ guiding layer 14 and the p-side $In_{1-z'}Ga_{z'}As_{y'}P_{1-y'}$ guiding layer 15 have an As composition ratio (y, y') of 0.70 and a Ga composition ratio (z, z') of 0.85. Further, the injection current is 20 mA, as in the above example.

In FIG. 9, reference numerals $a_5$, $b_5$, and $c_5$ indicate semiconductor laser devices that employ different n-type $In_{1-t}Ga_tAs_sP_{1-s}$ cladding layers and different p-type $In_{1-t'}Ga_{t'}As_{s'}P_{1-s'}$ cladding layers of the present invention. Specifically, reference numeral $a_5$ indicates a semiconductor laser device that employs an n-type $In_{0.44}Ga_{0.56}As_{0.1}P_{0.9}$ cladding layer and a p-type $In_{0.44}Ga_{0.56}As_{0.1}P_{0.9}$ cladding layer (i.e., $s=s'=0.1$, and $t=t'=0.56$). Reference numeral $b_5$ indicates a semiconductor laser device that employs an n-type $In_{0.39}Ga_{0.61}As_{0.2}P_{0.8}$ cladding layer and a p-type $In_{0.39}Ga_{0.61}As_{0.2}P_{0.8}$ cladding layer (i.e., $s=s'=0.2$, and $t=t'=0.61$). Reference numeral $c_5$ indicates a semiconductor laser device that employs an n-type $In_{0.34}Ga_{0.66}As_{0.3}P_{0.7}$ cladding layer and a p-type $In_{0.34}Ga_{0.66}As_{0.3}P_{0.7}$ cladding layer (i.e., $s=s'=0.3$, and $t=t'=0.66$). Further, reference numeral $d_5$ indicates a semiconductor laser device (comparative sample) that includes $Al_{0.15}Ga_{0.35}In_{0.50}P$ cladding layers as its n-side and p-side cladding layers. Also in this semiconductor laser device, the n-side $In_{1-z}Ga_zAs_yP_{1-y}$ guiding layer 14 and the p-side $In_{1-z'}Ga_{z'}As_{y'}P_{1-y'}$ guiding layer 15 (shown in FIG. 7) have an As composition ratio (y, y') of 0.70 and a Ga composition ratio (z, z') of 0.85.

The semiconductor laser devices of the present embodiment shown in FIG. 9 (employing InGaAsP cladding layers as described above) have a lower operating voltage than the comparative example regardless of the thickness of the guiding layers. It should be noted that although the InGaAsP cladding layers of these semiconductor laser devices have As composition ratios of 0.1, 0.2, and 0.3, respectively, the present invention is not limited to such cladding layers. The present embodiment allows a semiconductor laser device to oscillate with a reduced operating voltage if the As composition ratios of the cladding layers do not exceed those of the guiding layers.

Figure 10:
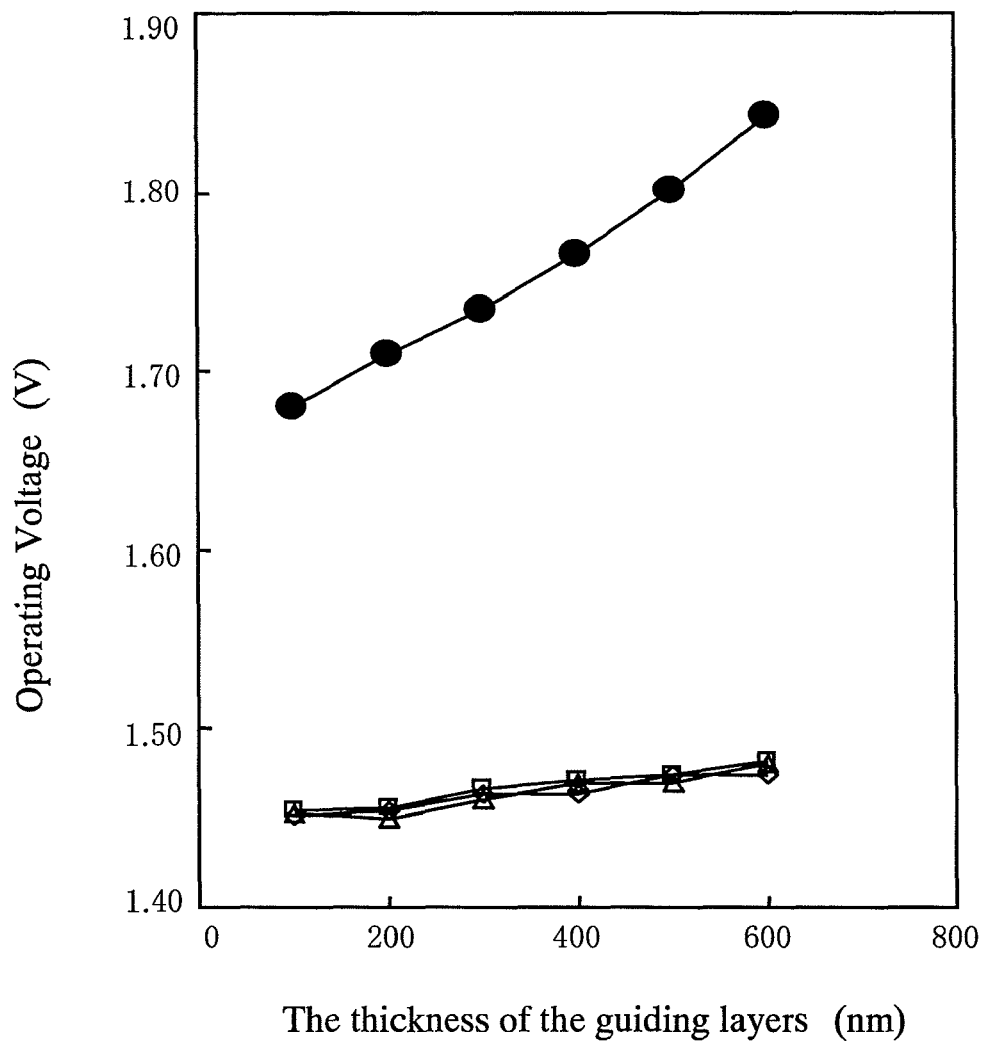
FIG. 10 shows still another diagram showing the relationship between the thickness of the guiding layers and the device operating voltage for various cladding layers.

FIG. 10 shows still another diagram showing the relationship between the thickness of the guiding layers and the device operating voltage for various cladding layers. It should be noted that the n-side $In_{1-z}Ga_zAs_yP_{1-y}$ guiding layer 14 and the p-side $In_{1-z'}Ga_{z'}As_{y'}P_{1-y'}$ guiding layer 15 have an As composition ratio (y, y') of 0.80 and a Ga composition ratio (z, z') of 0.90. Further, the injection current is 20 mA, as in the above example.

In FIG. 10, reference numerals $a_6$, $b_6$, and $c_6$ indicate semiconductor laser devices that employ different n-type $In_{1-t}Ga_tAs_sP_{1-s}$ cladding layers and different p-type $In_{1-t'}Ga_{t'}As_{s'}P_{1-s'}$ cladding layers of the present invention. Specifically, reference numeral $a_6$ indicates a semiconductor laser device that employs an n-type $In_{0.44}Ga_{0.56}As_{0.1}P_{0.9}$ cladding layer and a p-type $In_{0.44}Ga_{0.56}As_{0.1}P_{0.9}$ cladding layer (i.e., s=s'=0.1, and t=t'=0.56). Reference numeral $b_6$ indicates a semiconductor laser device that employs an n-type $In_{0.39}Ga_{0.61}As_{0.2}P_{0.8}$ cladding layer and a p-type $In_{0.39}Ga_{0.61}As_{0.2}P_{0.8}$ cladding layer (i.e., s=s'=0.2, and t=t'=0.61). Reference numeral $c_6$ indicates a semiconductor laser device that employs an n-type $In_{0.34}Ga_{0.66}As_{0.3}P_{0.7}$ cladding layer and a p-type $In_{0.34}Ga_{0.66}As_{0.3}P_{0.7}$ cladding layer (i.e., s=s'=0.3, and t=t'=0.66). Further, reference numeral $d_6$ indicates a semiconductor laser device (comparative sample) that includes $Al_{0.15}Ga_{0.35}In_{0.50}P$ cladding layers as its n-side and p-side cladding layers. Also in this semiconductor laser device, the n-side $In_{1-z}Ga_zAs_yP_{1-y}$ guiding layer 14 and the p-side $In_{1-z'}Ga_{z'}As_{y'}P_{1-y'}$ guiding layer 15 (shown in FIG. 7) have an As composition ratio (y, y') of 0.80 and a Ga composition ratio (z, z') of 0.90.

The semiconductor laser devices of the present embodiment shown in FIG. 10 (employing InGaAsP cladding layers as described above) have a lower operating voltage than the comparative example regardless of the thickness of the guiding layers. It should be noted that although the InGaAsP cladding layers of these semiconductor laser devices have As composition ratios of 0.1, 0.2, and 0.3, respectively, the present invention is not limited to such cladding layers. The present embodiment allows a semiconductor laser device to oscillate with a reduced operating voltage if the As composition ratios of the cladding layers do not exceed those of the guiding layers.

According to the present embodiment, the guiding layers (14, 15), which are undoped layers, preferably have a thickness of 100 nm or more to confine an increased amount of light therein. This decreases light absorption and thereby reduces losses, resulting in increased efficiency of the semiconductor laser device. Since the carrier diffusion length is approximately 2 μm to 3 μm, the maximum allowable thickness of the guiding layers is thought to be approximately 1 μm to 1.5 μm (approximately one half of the carrier diffusion length).

Thus, the semiconductor laser devices of the present embodiment employ InGaAsP cladding layers and InGaAsP guiding layers formed such that the As composition ratios of the cladding layers do not exceed those of the guiding layers, which results in reduced power consumption of the semiconductor laser devices. Further, since these semiconductor laser devices have a structure that does not contain Al, they achieve high reliability.

It should be understood that the present invention is not limited to the embodiments described above, and various alterations may be made thereto without departing from the spirit and scope of the invention.

For example, although the InGaAs active layers of the semiconductor laser devices of the present embodiment have been described as having an In composition ratio of 0.07, the present invention is not limited to such InGaAs active layers. For example, the oscillation wavelength of the semiconductor laser devices can be varied from approximately 900 to 1,100 nm by changing the In composition ratio of the active layer from approximately 0 to 0.2.

Further, although the semiconductor laser devices of the present embodiment have been described as having a single quantum well structure (i.e., having a single active layer), the present invention is not limited to this particular quantum well structure. The present embodiment can be applied to semiconductor laser devices having a multiquantum well structure (i.e., having a plurality of active layers), with the same effect.

Further, although the enhancement layers of the semiconductor laser devices of the present embodiment have been described as being GaAsP layers having a P composition ratio of 0.12, the present invention is not limited to such enhancement layers. For example, since the enhancement layers of these semiconductor laser devices have a function to counterbalance the strain caused by the InGaAs active layer, the P composition ratios of these enhancement layers are preferably increased as the In composition ratio of the active layer is increased. Further, if the band structure of the active layer is varied by deliberately applying a compressive strain to it, the semiconductor laser devices may not include enhancement layers.

The semiconductor laser devices of the present embodiment employ InGaAsP guiding layers having As composition ratios of 0.6, 0.7, and 0.8, respectively, and the above description has shown that these semiconductor laser devices can be adapted to have a reduced operating voltage. It should be noted, however, that the present invention is not limited to these InGaAsP guiding layers (having an As composition ratio of 0.6 to 0.8). The present embodiment allows a semiconductor laser device to have a reduced operating voltage even if it employs InGaAsP guiding layers having an As composition ratio lower than 0.6 or higher than 0.8.

That is, the present embodiment allows a semiconductor laser device to have a reduced operating voltage even if it employs InGaAsP guiding layers having an As composition ratio close to 0 (that is, having a bandgap energy close to that of InGaP) or close to 1 (that is, having a bandgap energy close to that of GaAs). However, when the As composition ratio of the guiding layers is close to 0, the amount of reduction in operating voltage is small, since their bandgap energy is close to that of the cladding layers. When the As composition ratio of the guiding layers is close to 1, on the other hand, the difference in bandgap energy between the active layer and the guiding layers is small, which prevents the active layer from efficiently confining carriers such as electrons and holes therein. This may result in a reduced electrical-to-optical power efficiency. Therefore, the guiding layers preferably have an As composition ratio of 0.6 to 0.8.

Further, the n-side and p-side guiding layers of the semiconductor laser devices of the present embodiment have been described as having the same As composition ratio, and furthermore the n-type and p-type cladding layers have also been described as having the same As composition ratio. However, the present invention is not limited to such an arrangement. According to the present embodiment, a semiconductor laser device can be adapted to have a reduced operating voltage if the following conditions are met: the n-side and p-side guiding layers are formed of InGaAsP lattice-matched to GaAs; the n-side and p-side cladding layers are formed of InGaAsP; the As composition ratio of the n-type cladding layer does not exceed that of the n-side guiding layer; and the As composition ratio of the p-type cladding layer does not exceed that of the p-side guiding layer. That is, the present invention allows a semiconductor laser device to have a reduced operating voltage even if its n-side and p-side guiding layers have different As composition ratios or its n-type and p-type cladding layers have different As composition ratios.

The features and advantages of the present invention may be summarized as follows.

According to the first aspect of the present invention, a semiconductor laser device employs AlGaAs cladding layers having an Al composition ratio of 0.4 or less, which allows the device to have reduced power consumption and enhanced reliability.

According to the second aspect of the present invention, the semiconductor laser device employs InGaAsP cladding layers and InGaAsP guiding layers formed such that the As composition ratio of each cladding layer does not exceed that of the closer one of the guiding layers, which allows the device to have reduced power consumption and enhanced reliability.

Obviously many modifications and variations of the present invention are possible in the light of the above teachings. It is therefore to be understood that within the scope of the appended claims the invention may be practiced otherwise than as specifically described.

The entire disclosure of a Japanese Patent Application No. 2006-355623, filed on Dec. 28, 2006 including specification, claims, drawings and summary, on which the Convention priority of the present application is based, are incorporated herein by reference in its entirety.

What is claimed is:

1. A semiconductor laser device comprising:
    an active layer;
    a pair of guiding layers sandwiching said active layer; and
    a pair of cladding layers sandwiching said active layer and said pair of guiding layers, wherein
        said active layer is InGaAs,
        each of said guiding layers is InGaAsP that is lattice-matched to GaAs,
        each of said cladding layers is InGaAsP, and
        As composition ratio of each InGaAsP cladding layer does not exceed As composition ratio of the one of said pair of InGaAsP guiding layers that is closer to each of said InGaAsP cladding layers.

2. The semiconductor laser device according to claim 1, wherein each of said InGaAsP guiding layers has an As composition ratio of 0.6 to 0.8.

3. The semiconductor laser device according to claim 1, wherein each of said InGaAsP guiding layers has a thickness of at least 100 nm.

4. The semiconductor laser device according to claim 2, wherein each of said InGaAsP guiding layers has a thickness of at least 100 nm.

* * * * *